(12) United States Patent  
Ishida et al.

(10) Patent No.: US 10,497,901 B2  
(45) Date of Patent: *Dec. 3, 2019

(54) DISPLAY DEVICE

(71) Applicant: SHARP KABUSHIKI KAISHA, Sakai, Osaka (JP)

(72) Inventors: Mamoru Ishida, Sakai (JP); Kazuhiko Tsuda, Sakai (JP); Yoshifumi Ohta, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/209,171

(22) Filed: Dec. 4, 2018

(65) Prior Publication Data

US 2019/0109298 A1 Apr. 11, 2019

Related U.S. Application Data

(63) Continuation of application No. 15/533,155, filed as application No. PCT/JP2015/006015 on Dec. 4, 2015, now Pat. No. 10,181,580.

(30) Foreign Application Priority Data

Dec. 5, 2014 (JP) .................................. 2014-246695

(51) Int. Cl.  
*H01L 51/52* (2006.01)  
*G09F 9/30* (2006.01)  
(Continued)

(52) U.S. Cl.  
CPC ............ *H01L 51/5256* (2013.01); *G09F 9/30* (2013.01); *H01L 51/0097* (2013.01); (Continued)

(58) Field of Classification Search  
CPC ............ H01L 51/5256; H01L 51/0097; H01L 51/5259; H01L 2251/5338  
See application file for complete search history.

(56) References Cited

U.S. PATENT DOCUMENTS 6,198,217 B1 3/2001 Smith  
7,767,498 B2 8/2010 Moro et al.  
(Continued)

FOREIGN PATENT DOCUMENTS

JP 2003-100450 A 4/2003  
JP 4196440 B2 12/2008  
(Continued)

OTHER PUBLICATIONS

Non-Final Office Action dated Mar. 29, 2018 for U.S. Appl. No. 15/533,155.

*Primary Examiner* — Mark W Tornow  
(74) *Attorney, Agent, or Firm* — ScienBiziP, P.C.

(57) ABSTRACT

An organic EL display device 1 includes a flexible plastic substrate 10, an organic EL element 4 on the plastic substrate 10, and a sealing film 2 provided on the plastic substrate 10 to cover the organic EL element 4. The sealing film 2 includes a first sealing layer 25 on a surface of the plastic substrate 10, a stress relief layer 26 on a surface of the first sealing layer 25, and a second sealing layer 27 on a surface of the stress relief layer 26. Compressive stress of the first sealing layer 25 is lower than compressive stress of the second sealing layer 27.

17 Claims, 6 Drawing Sheets

(51) Int. Cl.
*H01L 51/00* (2006.01)
*H01L 27/32* (2006.01)

(52) U.S. Cl.
CPC ...... *H01L 51/5259* (2013.01); *H01L 27/3244* (2013.01); *H01L 2251/5338* (2013.01); *Y02E 10/549* (2013.01)

(56) References Cited

U.S. PATENT DOCUMENTS

| | | | |
|---|---|---|---|
| 8,018,153 B2 | 9/2011 | Gotou | |
| 10,181,580 B2* | 1/2019 | Ishida | G09F 9/30 |
| 2003/0034497 A1 | 2/2003 | Yamazaki et al. | |
| 2003/0057422 A1 | 3/2003 | Yamazaki et al. | |
| 2003/0205845 A1 | 11/2003 | Pichler et al. | |
| 2005/0098113 A1 | 5/2005 | Hayashi | |
| 2005/0127371 A1 | 6/2005 | Yamazaki et al. | |
| 2007/0164295 A1 | 7/2007 | Yamazaki et al. | |
| 2008/0012471 A1* | 1/2008 | Cok | B82Y 10/00 313/503 |
| 2008/0303408 A1 | 12/2008 | Yamazaki et al. | |
| 2010/0163859 A1 | 7/2010 | Yamazaki et al. | |
| 2011/0233557 A1 | 9/2011 | Yamazaki et al. | |
| 2012/0161270 A1 | 6/2012 | Maehara et al. | |
| 2012/0187388 A1 | 7/2012 | Yamazaki et al. | |
| 2013/0228763 A1 | 9/2013 | Yamazaki et al. | |
| 2014/0077199 A1 | 3/2014 | Yamazaki et al. | |
| 2014/0326974 A1 | 11/2014 | Yamazaki et al. | |
| 2014/0346488 A1 | 11/2014 | Yamazaki et al. | |

FOREIGN PATENT DOCUMENTS

| | | |
|---|---|---|
| JP | 2010-244694 A | 10/2010 |
| JP | 2010-244697 A | 10/2010 |

* cited by examiner

DISPLAY DEVICE

TECHNICAL FIELD

The present invention relates to an organic EL display device including an organic electroluminescence element (hereinafter referred to as an "organic EL element").

BACKGROUND ART

In recent years, liquid crystal display devices are often used as flat panel displays in various fields. Contrast and tinge greatly vary depending, on viewing angles. A need for a light source such as a backlight hinders reduction in power consumption. Reduction in the thickness and weight of a liquid crystal device is limited. These serious problems still remain. Liquid crystal devices have also serious problems in flexibility.

To address the problems, self-luminous organic EL display devices using an organic EL element are expected in place of liquid crystal display devices in recent years. In an organic EL element, a current flows through an organic EL layer between an anode and a cathode so that organic molecules forming the organic EL layer emit light. Being self-luminous, organic EL display devices using such an organic EL element are excellent in reducing the thickness, weight, and power consumption. In addition, organic EL display devices provide a wide viewing angle, and thus draw great attentions as flat panel display candidates in next generation.

Organic EL display devices using a plastic substrate draw special attentions. A plastic substrate has higher flexibility, higher shock resistance, and lower weight than a glass substrate. A plastic substrate would provide new organic EL display devices beyond typical display devices using a glass substrate.

However, in general, after a certain period of drive, light-emitting characteristics, such as brightness and uniformity in light emission, of an organic EL element deteriorate significantly from the initial state. The deterioration in the light-emitting characteristics attributes to deterioration of an organic layer due to moisture of outside air, which has entered the organic EL element, or removal of the organic layer from an electrode due to moisture.

To address the problems, providing a sealing film to reduce entry of gas generated by moisture is disclosed. Specifically, a disclosed functional film includes a flexible plastic substrate (e.g., a film substrate), and an inorganic film (e.g., a $SiO_X$ thin film) on the plastic substrate. The inorganic film is deposited on the plastic substrate at a rate of 3 to 10 Å/sec, and compressive residual strain of 0.4 to 0.6% (stress of 280 Mpa to 430 Mpa) is applied to the inorganic film to be formed. This method increases compressive residual stress of an inorganic film, thereby manufacturing the inorganic film with increased fracture strain (see, e.g., Patent Document 1).

CITATION LIST

Patent Document

[Patent Document 1] Japan Patent No. 4196440

SUMMARY OF THE INVENTION

Technical Problem

However, in the method described in the Patent Document 1, an increase in the fracture strain of the $SiO_X$ thin film in an amount corresponding to the compressive residual strain reduces the adhesiveness of the $SiO_X$ thin film to the plastic substrate. This causes removal of the $SiO_X$ film from the plastic substrate, which results in reduction in barrier properties against moisture.

The $SiO_X$ thin film is thin and hard, and thus may crack when a flexible organic EL display device bends or curves. As a result, the $SiO_X$ thin film does not reliably block the moisture of the outside air to reduce deterioration of the organic EL element.

The present invention was made in view of the problems. It is an objective of the present invention to provide an organic EL display device, which reduces cracks at a sealing film and increases the adhesiveness of the sealing film to a plastic substrate to reduce deterioration of an organic EL element.

Solution to the Problem

In order to achieve the objective, the present invention provides a first organic EL display device including a flexible plastic substrate, an organic EL element on the plastic substrate, and a sealing film provided on the plastic substrate to cover the organic EL element. The sealing film includes a first sealing layer on a surface of the plastic substrate, a stress relief layer on a surface of the first sealing layer, and a second sealing layer on a surface of the stress relief layer. Compressive stress of the first sealing layer is lower than compressive stress of the second sealing layer.

With this configuration, the first sealing layer has lower compressive stress than the second sealing layer. This increases the adhesiveness of the first sealing layer to the plastic substrate when the organic EL display is bent or curved. Removal of the sealing film from the plastic substrate is thus reduced. As a result, barrier properties against moisture reduce deterioration of the organic EL element.

Since the second sealing layer, which is the outermost layer of the sealing film, has higher compressive stress than the first sealing layer, cracks decreases at the second sealing layer when the organic EL display device is bent or curved. Therefore, the second sealing, layer has barrier properties against moisture to reduce the deterioration of the organic EL element.

A second organic EL display device of the present invention includes a flexible plastic substrate, an organic. EL element on the plastic substrate, and a sealing film provided on the plastic substrate to cover the organic EL element. The sealing film is formed by alternately stacking sealing layers and stress relief layers. One of the sealing layers that is provided on a surface of the plastic substrate has lower compressive stress than the other sealing layers.

With this configuration, the sealing layer on the surface of the plastic substrate has lower compressive stress than the outermost sealing layer. This increases the adhesiveness of the sealing layer on the surface of the plastic substrate to the plastic substrate when the organic EL display device is bent or curved. Then, removal of the sealing film from the plastic substrate decreases. As a result, barrier properties against moisture reduce deterioration of the organic EL element.

Since the outermost sealing layer of the sealing film has higher compressive stress than the sealing layer on the surface of the plastic substrate, cracks decreases at the outermost sealing layer in bending and curving the organic EL display device. The outermost sealing layer of the sealing film has barrier properties against moisture to reduce deterioration of the organic EL element.

Advantages of the Invention

According to the present invention, a sealing layer has barrier properties against moisture to reduce deterioration of an organic EL element.

DESCRIPTION OF EMBODIMENTS

Embodiments of the present invention will now be described in detail with reference to the drawings. The present invention is not limited to the following embodiments.

First Embodiment

Figure 1:
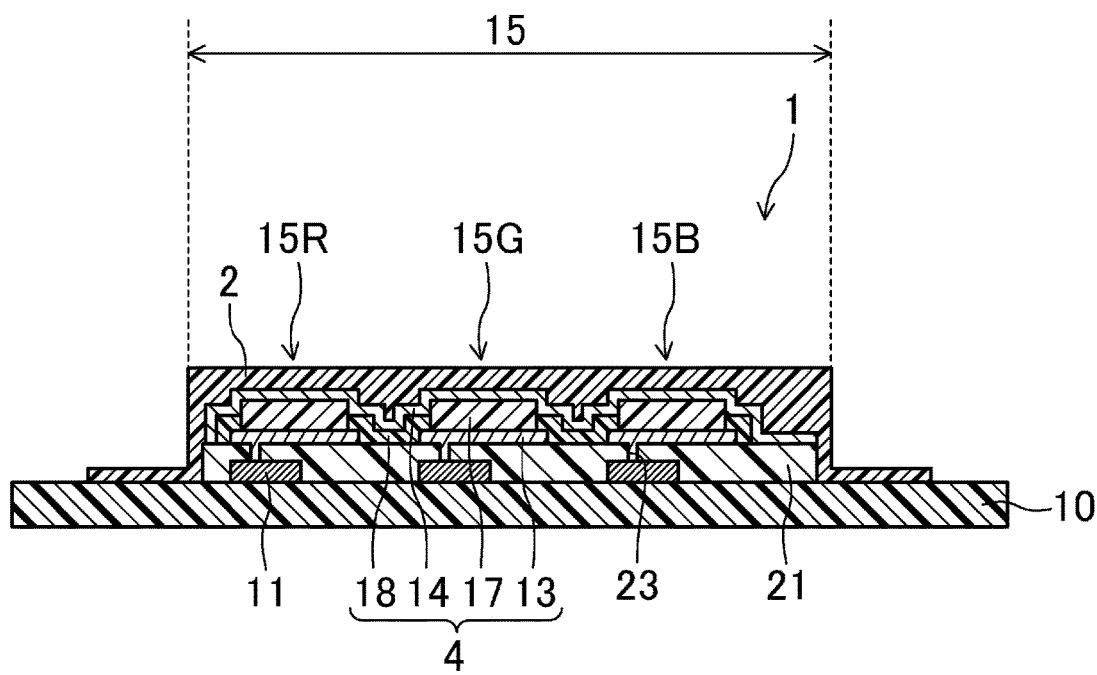
FIG. 1 is a cross-sectional view of an organic EL display device according to a first embodiment of the present invention.
Figure 2:
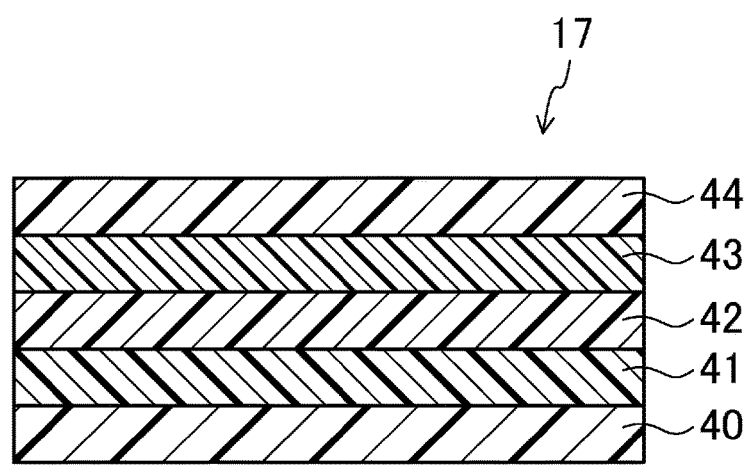
FIG. 2 is a cross-sectional view illustrating an organic EL layer forming an organic EL element included in the organic EL display device according to the first embodiment of the present invention.

FIG. 1 is a cross-sectional view often organic EL display device according to a first embodiment of the present invention. FIG. 2 is a cross-sectional view illustrating an organic EL layer forming an organic EL element included in the organic EL display device according to the first embodiment of the present invention.

As shown in FIG. 1, an organic EL display device 1 includes a plastic substrate 10 being an element substrate, and an organic EL element 4 above the plastic substrate 10.

The plastic substrate 10 is a flexible film-like substrate made of an insulating resin material. The resin material forming the plastic substrate 10 may be, for example, an organic material such as polyimide resin and acrylic resin.

As shown in FIG. 1, the organic EL display device 1 includes a display region 15 in which the organic EL element 4 is placed. In this display region 15, the organic EL element 4 has a matrix structure above the plastic substrate 10. This display region 15 is formed by arranging display regions 15R emitting red light, display regions 15G emitting green light, and display regions 15B emitting blue light in a predetermined pattern.

As shown in FIG. 1, each organic EL element 4 includes, above the plastic substrate 10, a predetermined array (e.g., a matrix) of first electrodes (anodes) 13, organic EL layers 17 on the respective first electrodes 13, and second electrodes 14 on the respective organic EL layers 17.

The organic EL element 4 also includes edge covers 18 to cover the peripheral edges of the first electrodes 13 and regions without the first electrodes 13. Each edge cover 18 is interposed between a pair of the pixel regions 15R, 15G, and 15B, and functions as a partition segmenting the pixel regions 15R, 15G, and 15B.

As shown in FIG. 1, the organic EL display device 1 includes TFTs 11 and an interlayer insulating film 21. Each TFT 11 is formed on the plastic substrate 10 and electrically connected to one of the first electrodes 13 arranged in a predetermined array. The interlayer insulating film 21 is formed on the plastic substrate 10 to cover the TFTs 11.

The first electrodes 13 function to inject holes to the respective organic EL layers 17. The first electrodes 13 are preferably made of a material with a high work function. This is because a material with a high work function allows the first electrodes 13 to inject holes to the organic EL layers 17 with higher efficiency. As shown in FIG. 1, the first electrodes 13 are formed on the interlayer insulating, film 21.

The material of the first electrodes 13 may include, for example, metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 13 may also be an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). The first electrodes 13 may also be a conductive oxide such as tin oxide (SnO), zinc oxide (ZnO), indium tin oxide (ITO), and indium zinc, oxide (IZO).

Each first electrode 13 may be a multilayer of the materials named above. The material with a high work function may be, for example, indium tin oxide (ITO) or indium zinc oxide (IZO).

The interlayer insulating film 21 is formed on the plastic substrate 10, and functions to flatten the surface of a film on which the TFTs 11 are provided. Due to this interlayer insulating film 21, the first electrodes 13 and the organic EL layers 17 are formed flat on or above the interlayer insulating film 21. That is, the interlayer insulating film 21 reduces an effect of steps or unevenness of the lower layers of the organic EL display device 1 on the shapes of the surfaces of the first electrodes 13, which causes ununiform light emission of the organic EL layer 17. The interlayer insulating film 21 is made of a highly transparent, low-cost organic resin material such as acrylic resin.

As shown in FIG. 1, the first electrodes 13 are electrically connected to the TFTs 11 via contact holes 23 formed in the interlayer insulating film 21.

Each organic EL layer 17 is formed on the surface of one of the first electrodes 13 segmented in a matrix. As shown in. FIG. 2, each organic EL layer 1 includes a hole injection layer 40, a hole transport layer 41, a light-emitting layer 42, an electron transport layer 43, and an electron injection layer 44. The hole transport layer 41 is formed on the surface of the hole injection layer 40. The light-emitting layer 42 is formed on the surface of the hole transport layer 41, and emits any one of red, green, and blue light. The electron transport layer 43 is formed on the surface of the light-emitting layer 42. The electron injection layer 44 is formed on the surface of the electron transport layer 43. Each organic EL layer 17 is formed by sequentially stacking the hole injection layer 40, the hole transport layer 41, the light-emitting layer 42, the electron transport layer 43, and the electron injection layer 44. Each organic EL layer 17 may have a smaller area than the underlying first electrode 13 or a larger area than the underlying first electrode 13 to cover the first electrode 13.

The hole injection layer 40 is also called an anode buffer layer, which approximates the energy levels between the first electrodes 13 and the organic EL layers 17 to increase the efficiency of the first electrodes 13 injecting the holes to the organic EL layers 17.

The material of the hole injection layer 40 may include, for example, triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 41 increases the efficiency in transporting holes from the first electrodes 13 to the organic EL, layers 17. The material of the hole transport layer 41 may include, for example, porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When a voltage is applied from the first electrodes 13 and the second electrodes 14, holes and electrons are injected from both the electrodes to the light-emitting layer 42, in which the holes and the electrons are recombined with each other. This light-emitting layer 42 is made of a material with high luminous efficiency. The material may include, for example, metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, henzoxazole derivatives, oxadiazole derivatives oxazole derivatives, benzimidazole derivatives, thiadiazole derivatives, benzothiazole derivatives, styryl derivatives, styrylamine derivatives, bis(styryl)benzene derivatives, tris(styryl)benzene derivatives, perylene derivatives, perinone derivatives, aminopyrone derivatives, pyridine derivatives, rodamine derivatives, acridine derivatives?, phenoxazone, quinacridone derivatives, rubrene, poly-p-phenylene vinylene, and polysilane.

The electron transport layer 43 functions to efficiently move electrons to the light-emitting layer. The material of the electron transport layer 43 may include, for example, as organic compounds, xadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 44 approximates the energy levels between the second electrodes 14 and the organic EL layers 17 to increase the efficiency in injecting electrons from the second electrode 14 into the organic EL layers 17, thereby reducing the drive voltage of the organic EL element 4. The electron injection layer is also called a cathode buffer layer. The material of the electron injection layer 44 may include, for example, inorganic alkaline compounds such as lithium fluoride (LiF), magnesium fluoride ($MgF_2$), calcium fluoride ($CaF_2$), strontium fluoride ($SrF_2$), barium fluoride ($BaF_2$), $Al_2O_3$, and SrO.

The second electrodes 14 function to inject electrons to the organic EL layers 17. The second electrodes 14 are preferably made of a material a low work function. This is because a material with a low work function allows the second electrodes 14 to inject electrons to the organic EL layers 17 with higher efficiency. As shown in FIG. 1, the second electrodes 14 are formed on the organic EL layers 17.

The material of the second electrodes 14 may include, for example, Oil (Ag), aluminum (Al), vanadium (V), cobalt (Co), nickel (Ni) tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrodes 14 may also be an alloy of magnesium (M)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). The second electrodes 14 may also be a conductive oxide such as a tin oxide (SnO), a zinc oxide (ZnO), an indium tin oxide (ITO), and an indium zinc oxide (IZO). The second electrodes 14 may be a multilayer made of the materials named above.

The material with a low work function may be, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The edge covers 18 function to reduce short-circuit between the first electrodes 13 and the second electrodes 14. Thus, in one preferred embodiment, the edge covers 18 cover the entire peripheral edges of the first electrodes 13.

The material of the edge covers 18 may include, for example, silicon dioxide ($SiO_2$), silicon nitride ($SiN_x$, where x s a positive number) such as $Si_3N_4$ and silicon oxynitride (SiNO).

As shown in FIG. 1, the organic EL display device 1 also includes a sealing film 2. This sealing film 2 protects the organic EL element 4 from moisture. As shown in FIG. 1, the sealing film 2 is provided above the plastic substrate 10 to cover the organic EL element 4.

Figure 3:
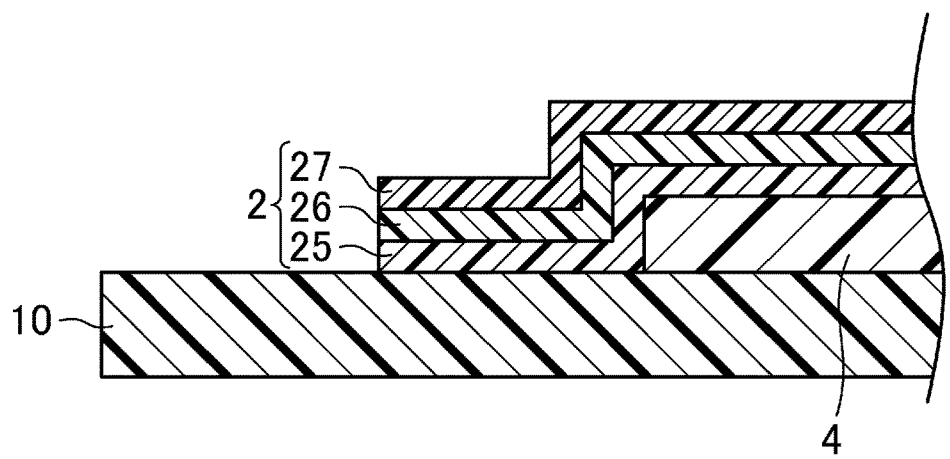
FIG. 3 is a cross-sectional view illustrating a configuration of a sealing film included in the organic EL display device according to the first embodiment of the present invention.

In this embodiment, as shown in FIG. 3, the sealing film 2 is provided on the surface of the plastic substrate 10. The sealing film 2 is a multilayer including a first sealing layer 25 in contact with the plastic substrate 10, a stress relief layer 26 on the surface of the first sealing layer 25, and a second sealing layer 27 on the stress relief layer 26.

In this embodiment, the first sealing layer 25 has lower compressive stress than the second sealing layer 27 (i.e., the second sealing layer 27 has higher compressive stress than the first sealing layer 25).

The "compressive stress" herein is the force caused when an object is compressed from the outside to balance the inside of the object, and may be measured by, for example, a thin film stress measurement system (Toho Technology Inc., FLX Series).

Figure 4:
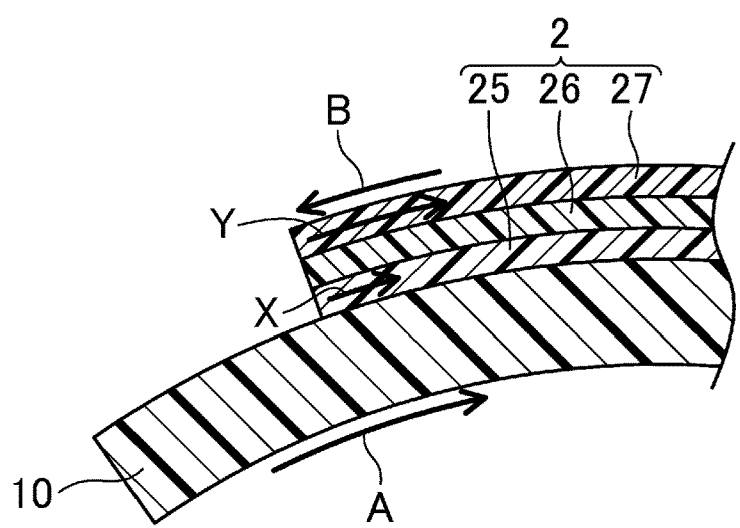
FIG. 4 illustrates compressive stress at the sealing film included in the organic EL display device according to the first embodiment of the present invention.

With this configuration, when the organic EL display device 1 is bent or curved in a predetermined direction, for example, as shown in FIG. 4, compressive stress A acts on the organic EL display device 1. However, the first sealing layer 25 on the surface of the plastic substrate 10 has low compressive stress X, and thus the adhesiveness of the first sealing layer 25 to the plastic substrate 10 increases when the organic EL display device 1 is bent or curved. Since removal of the sealing film 2 from the plastic substrate 10 being bent or curved is reduced, barrier properties against moisture improve to reduce deterioration of the organic EL element 4.

When the organic EL display device 1 is bent or curved in the predetermined direction as shown in FIG. 4, tensile stress B acts on the organic EL display device 1. However, the compressive stress Y of the second sealing layer 27, which is the outermost layer of the sealing film 2, is higher than the compressive stress X of the first sealing layer 25. The bending resistance of the second sealing layer 27 is secured when the organic EL display device 1 is bent or curved. Cracks are thus reduced at the second sealing layer 27. Therefore, the second sealing layer 27 has barrier properties against moisture to reduce the deterioration of the organic EL element 4.

In this embodiment, the second sealing layer 27 is provided on the stress relief layer 26. This configuration reduces the compressive stress of the second sealing layer 27 when the organic EL display device 1 is bent or curved. Thus, even if the compressive stress Y of the second sealing layer 27 is higher than the compressive stress X of the first sealing layer 25, the second sealing layer 27 is not removed when the organic EL display device 1 is bent or curved. Cracks are thus reduced.

In this embodiment, in view of reliably increasing the bending resistance of the second sealing layer 27, while maintaining the adhesiveness of the first sealing layer 25 to the plastic substrate 10, the difference in the compressive stress between the first and second sealing layers 25 and 27 falls within a range from 50 MPa to 300 MPa.

The materials of the first and second sealing layers 25 and 27 are not particularly limited, and may include inorganic materials such as silicon dioxide ($SiO_2$), aluminum oxide ($Al_2O_3$) silicon nitride ($SiN_x$, where x is a positive number) such as $Si_3N_4$ and silicon carbonitride (SiCN).

The material of the stress relief layer 26 may include, for example, organic materials such as polysiloxime, silicon oxycarbide (SiOC), acrylate, polyurea, parylene, polyimide, and polyimide.

In one preferred embodiment, in view of allowing the organic EL element 4 to have sufficient durability, the sealing film 2 has a thickness within the range from 1 to 100 μm.

An exemplary method of manufacturing an organic EL display device according to this embodiment will now be described. FIGS. 5 to 8 are cross-sectional views illustrating a method of manufacturing the organic EL display device according to an embodiment of the present invention.

Figure 5:
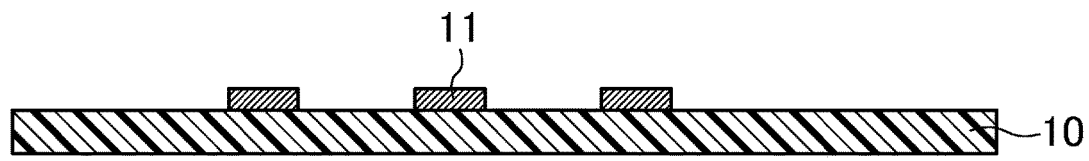
FIG. 5 is a cross-sectional view illustrating a method of manufacturing the organic EL display device according to the first embodiment of the present invention.

First, as shown in FIG. 5, the TFTs 11 for driving the organic EL element 4 are formed at predetermined intervals on the plastic substrate 10 in a size of 320×400 mm and with a thickness of 0.7 mm.

Figure 6:
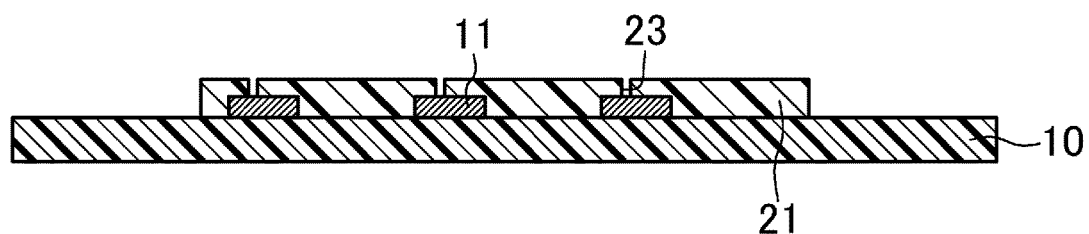
FIG. 6 is a cross-sectional view illustrating the method of manufacturing the organic EL display device according to the first embodiment of the present invention.

Next, as shown in FIG. 6, a photosensitive acrylic resin is applied onto the plastic substrate 10 including the TFTs 11 by spin coating. Using an exposure mask with a predetermined exposure pattern, photosensitive acrylic resin is exposed at a predetermined amount (e.g., 360 main$^2$). Then, development is performed using an alkaline developer. As a result, the interlayer insulating film 21 with a thickness of for example, 2 μm is formed. After the exposure, baking is performed as post-baking under a predetermined condition at a temperature of 220° C. for 60 minutes).

At this time, the contact holes 23 with a size of, for example, 5 μm for electrically connecting the first electrodes 13 to the TFTs 11 are formed on the interlayer insulating film 21.

Figure 7:
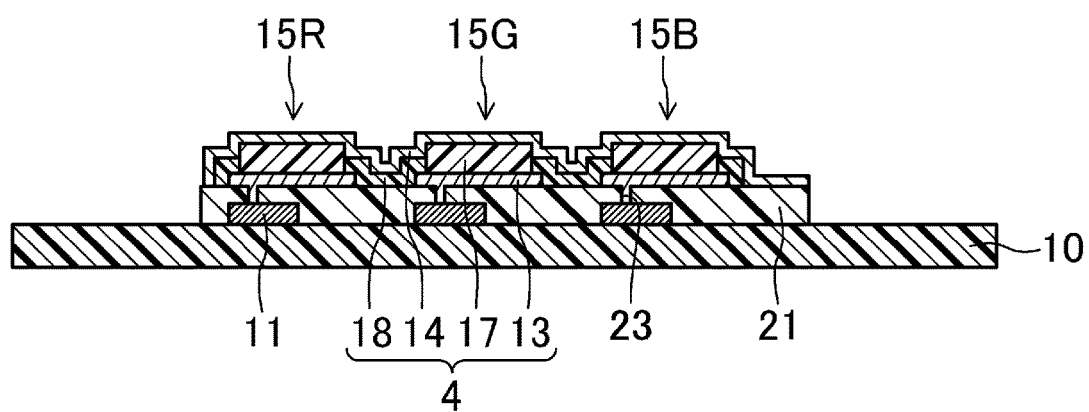
FIG. 7 is a cross-sectional view illustrating the method of manufacturing the organic. EL display device according to the first embodiment of the present invention.

As shown in FIG. 7, an ITO film is formed by sputtering, exposed to light by photolithography and developed, and patterned by etching to form the first electrodes 13 on the interlayer insulating film 21. At this time, the first electrodes 13 have a thickness of, about 100 nm, for example. After the development, baking is performed as post-baking under a predetermined condition (e.g., at a temperature of 220° C. 120 minutes). The first electrodes 13 are electrically connected to the TFTs 11 via the contact holes 23 formed in the interlayer insulating film 21.

As shown in FIG. 7, a silicon dioxide film is formed at the peripheral edges of the first electrodes 13 by sputtering, exposed to light by photolithography and developed, and patterned by etching to form the edge covers 18 to cover the entire peripheral edges of the first electrodes 13. At this time, the edge covers 18 have a thickness of about 150 nm, for example.

After that, the organic EL layers 17 including the light-emitting layer 42 are formed on the first electrodes 13. Then, the second electrodes 14 are formed on the organic EL layers 17. The organic EL layers 17 and the second electrodes 14 are formed by vapor deposition using a metal mask.

More specifically first, the plastic substrate 10 including the first electrodes 13 as shown in FIG. 7 is placed in a chamber of a vapor deposition system. Me inside of the chamber of the vapor deposition system is kept at a vacuum degree of $1 \times 10^{-5}$ to $1 \times 10^{-4}$ Pa by a vacuum pump. The plastic substrate 10 including the first electrodes 13 is placed with two sides fixed to a pair of substrate receiver attached to the inside of the chamber.

In an evaporation source, source materials (evaporants) of the hole injection layer 40, the hole transport layer 41, the light-emitting layer 42, the electron transport layer 43, and the electron injection layer 44 evaporate. Then, these layers are stacked to form the organic EL layers 17 in pixel regions as shown in FIG. 7.

Next, as shown in FIG. 7, the second electrodes 14 are formed can the organic EL layers 17. As a result, the organic EL element 4 including the first electrodes 13, the organic EL layers 17, the second electrodes 14, and the edge covers 18 are formed on or above the plastic substrate 10.

For example, a crucible containing the evaporants are used as the evaporator source. The crucible is placed at a lower position inside the chamber, and includes a heater, which heats the crucible.

The heat of the heater allows the temperature inside the crucible to reach the evaporation temperatures of the evaporants so that the evaporants inside the crucible jump out upward as vapor inside the chamber.

A specific example method of forming the organic EL layers 17 and the second electrodes 14 is as follows. First, the hole injection layer 40 made of m-MTDATA(4,4,4-tris(3-methylphenylphenylamino)triphenylamine) is formed with a thickness of, for example, 25 nm in common among all RGB pixels on the first electrodes 13, which is patterned on the plastic substrate 10, via a mask.

Then, the hole transport layer 41 made of α-NPD(4,4-bis(N-1-naphthyl-N-phenylamino)biphenyl) is formed with a thickness of, for example, 30 nm in common among all RGB pixels on the hole injection layer 40 via a mask.

Next, the light-emitting layer 42 of the red color is formed with a thickness of, for example, 30 nm on the hole transport layer 41 in the associated pixel regions via a mask. The light-emitting layer 42 of the red color is formed by mixing 30 wt % of 2,6-bis((4'-methoxydiphenylamino)styryl)-1,5-dicyanonaphthalene (BSN) into di(2-naphthyl)anthracene (ADN).

After that, the light-emitting layer 42 of the green color is formed with a thickness of, for example, 30 nm on the hole transport layer 41 in the associated pixel regions via a mask. The light-emitting layer 42 of the green color is formed by mixing 5 wt % of coumarin 6 into ADN.

Then, the light-emitting layer 42 of the blue color is formed with a thickness of, for example, 30 nm on the hole transport layer 41 in the associated pixel regions via a mask. The light-emitting layer 42 of the blue color is formed by mixing 2.5 wt % of 4,4'-bis(2-{4-(N,N-diphenylamino)phenyl}vinyl)biphenyl(DPAVBi) into ADN.

Next, 8-hydroxyquinoline aluminum (Alq3) is formed, as the electron transport layer 43, with a thickness of for example, 20 nm common among all RGB pixels on the light-emitting layer 42 of all the colors via a mask.

After that, lithium fluoride (LiF) is formed, as the electron injection layer 44, with a thickness of for example, 0.3 nm on the electron transport layer 43 via a mask.

Then, the second electrodes 14 made of aluminum (Al) are formed with a thickness of, for example, 10 nm by vacuum vapor deposition.

Figure 8:
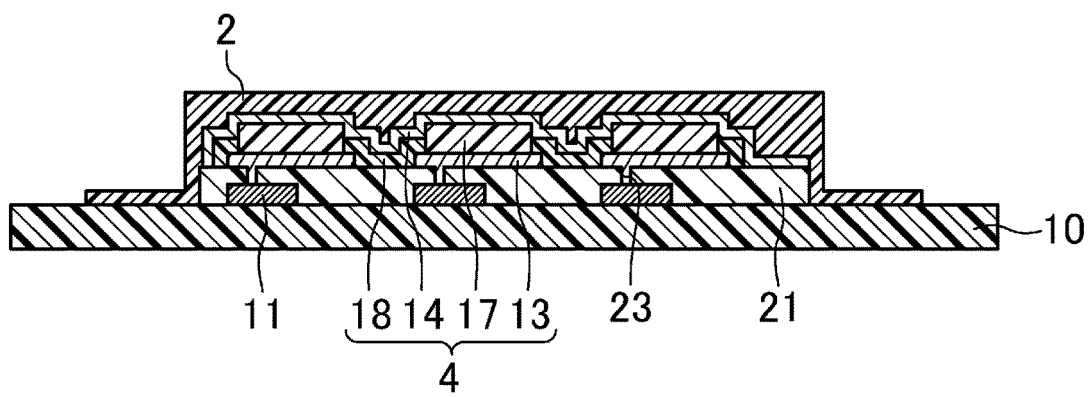
FIG. 8 is a cross-sectional view illustrating the method of manufacturing the organic EL display device according to the first embodiment of the present invention.

After that, as shown in FIG. 8, the sealing film 2 is formed on the plastic substrate 10 to cover the organic EL element 4. More specifically, first, inorganic materials such as silicon dioxide ($SiO_2$) and aluminum oxide ($Al_2O_3$) are stacked on the surfaces of the plastic substrate 10 and the organic EL element 4 by plasma CVD, vacuum vapor deposition, sputtering, atomic layer deposition (ALD) or other methods to form the first sealing layer 25.

Next, organic materials such as acrylate, popolyurea, parylene, polyimide, and polyamide are stacked on the surface of the first sealing layer 25 by vacuum vapor deposition to form the stress relief layer 26.

Like the first sealing layer 25 described above, inorganic materials such as silicon dioxide ($SiO_2$) and aluminum oxide ($Al_2O_3$) are stacked on the surface of the stress relief layer 26 by plasma CVD, vacuum vapor deposition sputtering, atomic layer deposition (ALD), or other methods to form the second sealing layer 27. As a result, the sealing film 2 including the first sealing layer 25, the stress relief layer 26, and the second sealing layer 27 is formed.

In the manner, the organic EL display device of this embodiment can be manufactured.

This embodiment described above provides the following advantages.

1. In this embodiment, the sealing film 2 includes the first sealing layer 25 on the surface of the plastic substrate 10, the stress relief layer 26 on the surface of the first sealing layer 25, and the second sealing layer 27 on the stress relief layer 26. The first sealing layer 25 has lower compressive stress than the second sealing layer 27. Since the first sealing layer 25 on the surface of the plastic substrate 10 has a low compressive stress, the adhesiveness of the first sealing layer 25 to the plastic substrate 10 increases when the organic EL display device 1 is bent or curved. As a result, removal of the sealing film 2 from the plastic substrate 10 decreases when the organic EL display device 1 is bent or curved. Thus, barrier properties against moisture improve to reduce deterioration of the organic EL element 4.

2. The compressive stress Y of the second sealing layer 27, which is the outermost layer of the sealing film 2, is higher than the compressive stress X of the first sealing layer 25. This configuration reduces cracks at the second sealing layer 27 when the organic EL display device 1 is bent or curved. Thus, the second sealing layer 27 has improved barrier properties against moisture to reduce the deterioration of the organic EL element 4.

3. Since the second sealing layer 27 is formed on the stress relief layer 26, the compressive stress of the second sealing layer 27 decreases when the organic EL display device 1 is bent or curved. Thus, even if the compressive stress Y of the second sealing layer 27 is higher than the compressive stress X of the first sealing layer 25, the second sealing layer 27 is not removed when the organic EL display device 1 is bent or curved. Cracks are thus reduced.

4. In this embodiment, the difference in the compressive stress between the first and second sealing layers 25 and 27 falls within a range from 50 Mpa to 300 Mpa. With this configuration, while the first sealing layer 25 maintains its adhesiveness to the plastic substrate 10, the second sealing layer 27 has reliably increased bending resistance.

5. In this embodiment, the first sealing layer 25 is formed by plasma CVD. With this configuration, the first sealing layer 25 has higher adhesiveness to the plastic substrate 10.

6. In this embodiment, the second sealing layer 27 is formed by plasma CVD. This further reduces cracks at the second sealing layer 27 when the organic EL display device 1 is bent or curved.

7. In this embodiment, the stress relief layer 26 is formed by plasma CVD. This further reduces removal of the second sealing layer 27 when the organic EL display device 1 is bent or curved.

Second Embodiment

Figure 9:
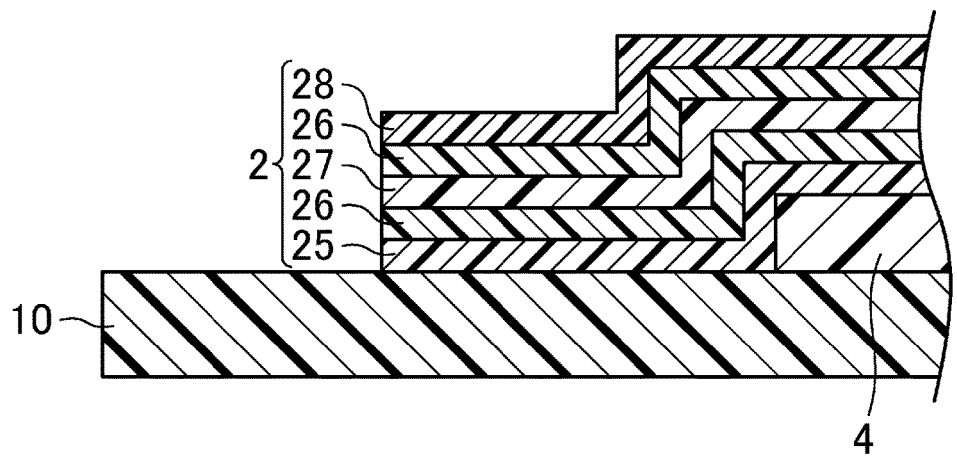
FIG. 9 is a cross-sectional view illustrating a configuration of a sealing film included in an organic EL display device according to a second embodiment of the present invention.

A second embodiments of the present invention will now be described. FIG. 9 is a cross-sectional view illustrating a configuration of a sealing film according to the second embodiment of the present invention. The overall configuration of the organic EL display device is the same as that in the first embodiment, and thus detailed description will be omitted. The same reference numerals as those in the first embodiment are used to represent equivalent elements, and the detailed explanation thereof will be omitted.

The organic EL display device of this embodiment has the following features as shown in FIG. 9. The sealing film 2 includes a third sealing layer 28. The sealing layers (i.e., the first, second, and third sealing layers 25, 27, and 28) and the stress relief layers 26 are stacked alternately (three sealing layers and two the stress relief layers 26 are stacked alternately in FIG. 9).

With this configuration, in this embodiment, the sealing film 2 has higher barrier properties against moisture.

Like the first and second sealing layers 25 and 27, the third sealing layer 28 is made of an inorganic material such as silicon dioxide ($SiO_2$), aluminum oxide ($Al_2O_3$), silicon nitride ($SiN_x$, where x is a positive number) such as $Si_3N_4$, and silicon carbonitride (SiCN).

Like the first and second sealing layers 25 and 27, the third sealing layer 28 is formed by stacking inorganic materials such as silicon dioxide ($SiO_2$), aluminum oxide ($Al_2O_3$) on the surface of the stress relief layer 26 by plasma CVD, vapor deposition, sputtering, atomic layer deposition (ALD), or other methods.

As in the first embodiment, one of the sealing layers that is provided on the surface of the plastic substrate 10 (i.e., the first sealing layer 25) has lower compressive stress than the other sealing layers (i.e., the second and third sealing layers 27 and 28) of the sealing film 2.

The embodiment described above provides the following advantage in addition to the advantages 1 to 7.

8. In this embodiment, the sealing film 2 is formed by alternately stacking the sealing layers and the stress relief layers. With this configuration, the sealing film 2 has greater barrier properties against moisture to reliably reduce the deterioration of the organic EL element 4.

Third Embodiment

Figure 10:
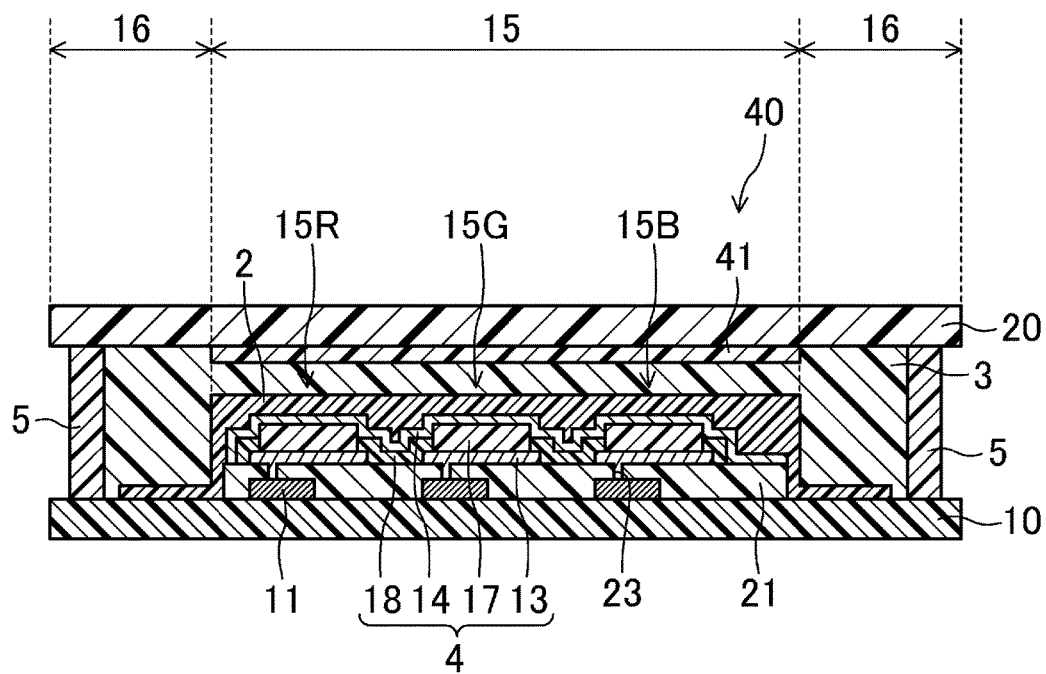
FIG. 10 is a cross-sectional view of an organic EL display device according to a third embodiment of the present invention.

A third embodiment of the present invention will now be described. FIG. 10 is a cross-sectional view illustrating a configuration of a sealing film according to the third embodiment of the present invention. The same reference numerals as those in the first embodiment are used to represent equivalent elements, and the detailed explanation thereof will be omitted.

In this embodiment, as shown in FIG. 10, an organic EL display device 40 includes a plastic substrate 20, which is a sealing substrate facing the plastic substrate 10. The organic EL element 4 formed on the plastic substrate 10 is interposed between the plastic substrates 10 and 20.

The organic EL display device 40 includes a sealing material 5, which is interposed between the plastic substrates 10 and 20 and bonds the plastic substrates 10 and 20 together to encapsulate the organic EL element 4.

The sealing material 5 is formed in a frame around the organic EL element 4. The plastic substrates 10 and 20 are bonded together by this sealing material 5.

The plastic substrate 20 is a flexible film-like substrate made of an insulating resin material. The resin material forming the plastic substrate 20 may be, for example, an organic material such as polyimide resin and acrylic resin.

The plastic substrate 20 includes a color filter 41 composed of layers colored in red, green, or blue, and black matrixes adjacent to the colored layers.

As shown in FIG. 10, the organic EL display device 40 includes a display region 15 surrounded by the sealing material 5. In this display region 15, the organic EL element 4 has a matrix structure above the plastic substrate 10, which faces the plastic substrate 20. As described above, this display region 15 is formed by arranging display regions 15R emitting red light, display regions 15G emitting green light, and display regions 15B emitting blue light in a predetermined pattern.

As shown in FIG. 10, the organic EL display device 40 also includes a filler 3 functioning as a getter (functioning to adsorb oxygen or moisture). As shown in FIG. 10, the filler 3 is provided on the sealing film 2 to cover the sealing film 2.

The material of the filler 3 may include, for example, epoxy resin (e.g., thermosetting one-part epoxy resin) and silicon resin. In view of improving adsorption of moisture, the filler 3 contains an alkaline earth metal oxide such as calcium oxide (CaO) and barium oxide (BaO) and a desiccant such as silica gel and zeolite.

The sealing material 5 bonds the plastic substrates 10 and 20 together and fixes the plastic substrates 10 and 20. The material of the sealing material 5 may include, for example, epoxy resin, ultraviolet (UV) curable resin such as acrylic resin, and thermosetting resin.

As shown in FIG. 10, in the organic EL display device 40, a frame region (i.e., a seal formation region) 16 for the sealing material 5 is defined around the display region 15. As shown in FIG. 10, the sealing material 5 is provided in a frame in the frame region 16 to encapsulate the organic EL element 4, and bonds the plastic substrates 10 and 20 together.

In manufacturing the organic EL display device 40 of this embodiment, first, the color filter 41 is formed on the plastic substrate 20 in a size of 320×400 mm and with a thickness of 0.7 mm.

More specifically, positive photosensitive resin is applied onto the entire plastic substrate 20 by spin coating. In the photosensitive resin, a black pigment such as carbon fine particles is dispersed. After that, the applied photosensitive resin is exposed to light via a photomask, and then patterned by development and beating to form the black matrix with a thickness of, for example, 2.5 μm on the plastic substrate 20.

Then, an acrylic photosensitive resin colored in for example, red, green, or blue is applied onto a substrate with the black matrix. The applied photosensitive resin is exposed to light via a photomask, and then patterned by development to form a layer colored in the selected color (e.g., a red layer R) with a thickness of, for example, 2.5 μm. For the other two colors, similar steps are repeated. Layers colored in the other two colors (e.g., a green layer G and a blue layer B) with a thickness of, for example, 2.5 μm to form the color filter 41 including the colored layers (the red, green, and blue layers R, G, and B).

Next, the material such as the epoxy resin is applied onto the plastic substrate 20 with the color filter 41 by dispending, mask printing, screen printing, or other methods to form the sealing material 5 in a frame.

Spacers (not shown are mixed into the sealing material 5 to control the distance between the plastic substrates 10 and 20. The spacers are made of, for example, silicon dioxide ($SiO_2$).

After that, the material of the filler 3 is applied to the inside the sealing material 5 on the plastic substrate 20 to be spaced apart from the sealing material 5 by dispending, mask printing, drop injection, or other methods. In place of the material to be applied, a sheet-like material may be used.

Next, in a vacuum atmosphere, the plastic substrate 20 with sealing material 5 is stacked above the plastic substrate 10 with the organic EL element 4 and the sealing film 2 (see FIG. 1) so that the material of the filler 3 overlaps the organic EL element 4. The surface of the sealing material 5 on the plastic substrate 20 is mounted on the surface of the plastic substrate 10 in the frame region 16.

Then, under a predetermined condition (e.g., under a pressure of 100 Pa or lower), the inside of the sealing material 5 is kept in airtight vacuum, in a vacuum atmosphere, the plastic substrate 20 is moved toward the plastic substrate 10 and pressed to bond the plastic substrates 10 and 20 together via the sealing material 5. As a result, a bond of the plastic substrates 10 and 20 is formed.

In bonding the plastic substrates 10 and 20 together, the pressure evenly diffuses the material of the filler 3, which is formed on the surface of the plastic substrate 20, inside sealing material 5. The filler 3 is provided on the sealing film 2 to cover the sealing film 2.

Next, the vacuum is purged to the atmospheric pressure (i.e., returning the vacuum to the atmospheric pressure). Then, the plastic substrate 20 is irradiated with ultraviolet (UV) light to cure the resin forming the sealing material 5. As a result, the organic EL display device 40 shown in FIG. 10 is manufactured.

The embodiment described above provides the following advantage in addition to the advantages 1 to 7.

9. In this embodiment, the sealing material 5 configured to encapsulate the organic EL element 4 and the filler 3 configured to cover the sealing film 2 are provided. The sealing material 5 and the filler 3 block water and oxygen permeating from the outside into the sealing film 2. The deterioration of the organic EL element is reliably reduced.

The embodiments may be modified as follows.

In the second embodiment, three sealing layers and two stress relief layers are stacked alternately to form the sealing film 2. However, the numbers of sealing layers and the stress relief layers are not particularly limited. For example, ten sealing layers and nine stress relief layers may he stacked alternately.

In the second embodiment, as in the third embodiment, the configuration may include another plastic substrate, a sealing material, and a filler. The other plastic substrate faces the plastic substrate 10. The sealing material is interposed between the plastic substrate 10 and the other plastic substrate, and bonds the plastic substrate 10 and the other plastic substrate together to encapsulate the organic EL element 4. The filler is provided on the sealing film 2 to cover the sealing film 2. This case also provides advantages similar to those in the third embodiment.

Figure 11:
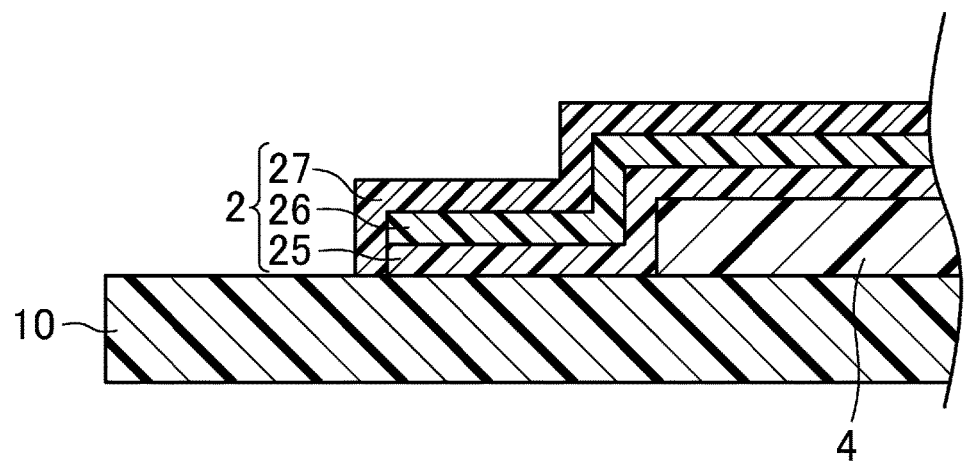
FIG. 11 is a cross-sectional view illustrating a configuration of a sealing film included in an organic EL display device according to a variation of the present invention.

In the first embodiment, the second sealing layer 27 may cover the stress relief layer 26, as shown in FIG. 11. With this configuration, the sealing film 2 has greater barrier properties against moisture to reliably reduce the deterioration of the organic EL element 4.

Figure 12:
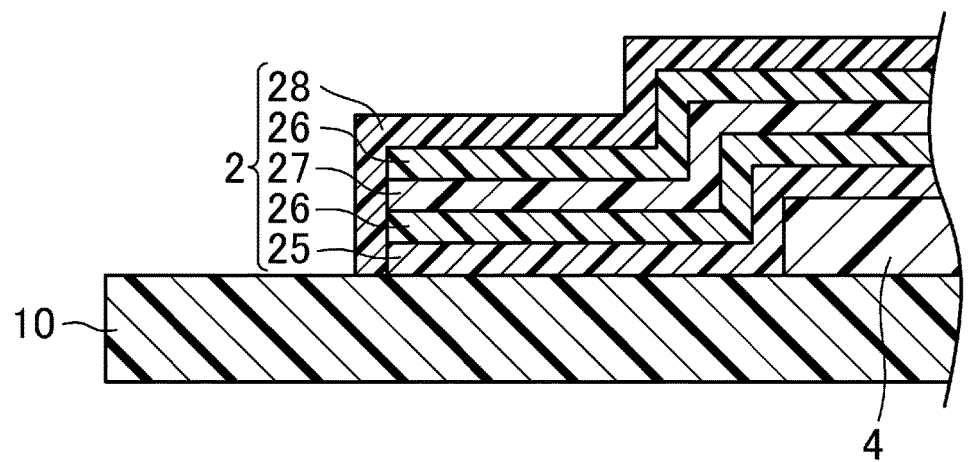
FIG. 12 is a cross-sectional view illustrating a configuration of a sealing film included in an organic EL display device according to another variation of the present invention.

In the sealing film 2 described in the second and third embodiments, the outermost layer (i.e., the third sealing layer 28) may cover the stress relief layer 26 as shown in FIG. 12.

In the embodiments described above, each of the organic EL layers 17 has a multilayer structure of five layers of the hole injection layer 40, the hole transport layer 41, the light-emitting layer 42, the electron transport layer 43, and the electron injection layer 44. The multilayer structure is not hunted to five layers. For example, the multilayer structure may include three layers of a hole injection and transport layer, a light-emitting layer, and au electron injection and transport layer.

The multilayer structure may be inverted so that the first electrodes 13 function as cathodes, and the second electrodes 14 function as anodes, in this case, the multilayer structure may include, from the bottom, the first electrodes 13 as cathodes, the electron injection layer 44, the electron transport layer 43, the light-emitting layer 42, the hole transport layer 41, the hole injection layer 40, and the second electrodes 14 as anodes. In this case, the material of the first electrodes 13 is replaced with the material of the second electrodes 14.

INDUSTRIAL APPLICABILITY

As described above, the present invention is suitable for an organic EL display device including an organic EL element.

DESCRIPTION OF REFERENCE CHARACTERS

| | |
|---|---|
| 1 | Organic EL Display Device |
| 2 | Sealing Film |
| 3 | Filler |
| 4 | Organic EL Element |
| 5 | Sealing Material |
| 10 | Plastic Substrate |
| 17 | Organic EL Layer |
| 20 | Plastic Substrate (Another Plastic Substrate) |
| 25 | First Sealing Layer |
| 26 | Stress Relief Layer |
| 27 | Second Sealing Layer |
| 28 | Third Sealing Layer |
| 40 | Organic EL Display Device |

The invention claimed is:

1. A display device comprising:
a flexible plastic substrate;
an electroluminescence element disposed on the plastic substrate; and
a sealing film disposed on the electroluminescence element, wherein
the sealing film includes a first inorganic layer disposed on the electroluminescence element, an organic layer disposed on the first inorganic layer, and a second inorganic layer disposed on the organic layer,
compressive stress of the first inorganic layer is lower than compressive stress of the second inorganic layer,
the organic layer has another surface entirely disposed on the first inorganic layer, and
the second inorganic layer covers an end of the first inorganic layer and an end of the organic layer.

2. The display device of claim 1, wherein
a difference between the compressive stress of the first inorganic layer and the compressive stress of the second inorganic layer falls within a range from 50 MPa to 300 MPa.

3. The display device of claim 1, wherein
the second inorganic layer covers the organic layer.

4. The display device of claim 1, wherein
the first inorganic layer is formed by plasma CVD.

5. The display device of claim 1, wherein
the second inorganic layer is formed by plasma CVD.

6. The display device of claim 1, wherein
the organic layer is formed by plasma CVD.

7. The display device of claim 1, further comprising:
another plastic substrate facing the plastic substrate;
a sealing material provided between the plastic substrate and the other plastic substrate and bonding the plastic substrate and the other plastic substrate together to encapsulate the electroluminescence element; and
a filler provided on the sealing film to cover the sealing film.

8. The display device of claim 1, wherein
the sealing material is formed in a frame around the electroluminescence element, the plastic substrate and a flexible upper plastic substrate are bonded together, and
an end of the sealing film is inside the sealing material.

9. The display device of claim 8, further comprising:
a filler in the sealing material, the filler covering the sealing film and functioning as a getter.

10. The display device of claim 1, wherein
the electroluminescence element includes, in an order of, a first electrode, a light-emitting layer, and a second electrode from the plastic substrate.

11. The display device of claim 10, wherein
the first electrode includes at least any one of silver, aluminum, indium tin oxide, or indium zinc oxide.

12. The display device of claim 11, wherein
the first electrode is a multilayer.

13. The display device of claim 10, wherein
the second electrode includes at least any one of silver, aluminum, indium tin oxide, or indium zinc oxide.

14. The display device of claim 13, wherein
the second electrode is a multilayer.

15. The display device of claim 1, wherein
the electroluminescence element further includes a hole injection layer including any one of: triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, or stilbene derivatives.

16. The display device of claim 1, wherein
the electroluminescence element further includes an electron transport layer including any one of: oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, or metal oxinoid compounds.

17. The display device of claim 1, wherein
the electroluminescence element further includes an electron injection layer including any one of: lithium fluoride, magnesium fluoride, calcium fluoride, strontium fluoride, barium fluoride, $Al_2O_3$, or SrO.

* * * * *